(12) United States Patent
Lee et al.

(10) Patent No.: US 10,283,065 B2
(45) Date of Patent: May 7, 2019

(54) DISPLAY DEVICE AND DRIVING METHOD THEREOF

(71) Applicant: LG Display Co., Ltd., Seoul (KR)

(72) Inventors: Dogon Lee, Goyang-si (KR); Yeontaek Yoo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 115 days.

(21) Appl. No.: 15/360,461

(22) Filed: Nov. 23, 2016

(65) Prior Publication Data

US 2017/0148407 A1 May 25, 2017

(30) Foreign Application Priority Data

Nov. 25, 2015 (KR) .......................... 10-2015-0165751
Nov. 1, 2016 (KR) .......................... 10-2016-0144627

(51) Int. Cl.
*G09G 3/36* (2006.01)
*H03K 19/0175* (2006.01)
*G09G 3/20* (2006.01)
*G09G 5/18* (2006.01)

(52) U.S. Cl.
CPC ......... *G09G 3/3677* (2013.01); *G09G 3/2096* (2013.01); *G09G 3/3688* (2013.01); *G09G 5/18* (2013.01); *H03K 19/017509* (2013.01); *G09G 2300/0426* (2013.01);
(Continued)

(58) Field of Classification Search
CPC .. G09G 3/3677; G09G 3/3688; G09G 3/2096; G09G 5/18; G09G 2300/0426; G09G 2310/0289; G09G 2310/08; G09G 2370/08; H03K 19/017509
See application file for complete search history.

(56) References Cited

U.S. PATENT DOCUMENTS 7,965,045 B2 6/2011 Tahata
8,253,719 B2 8/2012 Park et al.
(Continued)

FOREIGN PATENT DOCUMENTS

CN 101226726 A 7/2008
CN 101236731 A 8/2008
CN 103325353 A 9/2013

OTHER PUBLICATIONS

European Extended Search Report, European Application No. 16200238.0, dated Mar. 31, 2017, 8 pages.
(Continued)

*Primary Examiner* — Vinh T Lam
(74) *Attorney, Agent, or Firm* — Fenwick & West LLP

(57) ABSTRACT

A display device comprises: a timing controller that is turned on to a floating state by a first logic voltage and, after a switching period, switches from the floating state to a normal operating state based on a reset signal to generate timing control signals; a level shifter configured to receive the first logic voltage and a second logic voltage and level-shift the timing control signals to the second logic voltage; and an output enable signal control part that outputs an output enable signal at enable level LOW or disable level HIGH, in synchronization with the reset signal, wherein, during the switching period, the level shifter receives the output enable signal at the disable level HIGH and does not level-shift the timing control signals.

17 Claims, 4 Drawing Sheets

(52) U.S. Cl.
CPC .  *G09G 2310/0289* (2013.01); *G09G 2310/08* (2013.01); *G09G 2370/08* (2013.01)

(56) References Cited

U.S. PATENT DOCUMENTS

| | | | | |
|---|---|---|---|---|
| 9,024,681 | B2* | 5/2015 | Murakami | H04L 25/0272 327/543 |
| 9,024,930 | B2* | 5/2015 | Nagao | G09G 3/3648 345/211 |
| 9,076,399 | B2 | 7/2015 | Park | |
| 9,378,667 | B2* | 6/2016 | Su | G09G 3/00 |
| 2008/0178016 | A1 | 7/2008 | Tahata | |
| 2008/0180429 | A1 | 7/2008 | Park et al. | |
| 2009/0225104 | A1 | 9/2009 | Hu et al. | |
| 2013/0249781 | A1 | 9/2013 | Park | |
| 2014/0049532 | A1 | 2/2014 | Choi et al. | |
| 2014/0306948 | A1* | 10/2014 | Iwamoto | G09G 3/3648 345/213 |
| 2015/0054565 | A1* | 2/2015 | Jin | G01R 31/31924 327/333 |
| 2015/0332632 | A1* | 11/2015 | Nakata | G09G 3/2092 345/690 |
| 2015/0349776 | A1* | 12/2015 | Abouda | H03K 19/017509 327/109 |

OTHER PUBLICATIONS

First Office Action, Chinese Patent Application No. 201611044029.5, dated Dec. 5, 2018, 22 pages.

* cited by examiner

DISPLAY DEVICE AND DRIVING METHOD THEREOF

CROSS-REFERENCE TO RELATED APPLICATION

This application claims priority to Korean Patent Application No. 10-2015-0165751 filed on Nov. 25, 2015, and Korean Patent Application No. 10-2016-0144627 filed Nov. 1, 2016, which are each hereby incorporated by reference in its entirety.

BACKGROUND

Field of the Invention

Embodiments of the invention relate to a display device and a driving method thereof.

Discussion of the Related Art

The main types of display devices include liquid crystal displays (LCDs) and OLED displays comprising organic light emitting diodes (OLED). The OLED displays and the LCDs come in various sizes, from small to large, and are used in many electronic devices such as mobile phones, laptops, monitors, TVs, etc.

A display device may comprise a display panel with a plurality of pixels arranged in a matrix, a gate driver that drives gate lines on the display panel, a data driver that drives data lines on the display panel, a timing control part that controls the gate driver and the data driver, among other components. The gate driver may be embedded in the display panel to reduce volume and weight, and this type of display is called a GIP (Gate In Panel) display.

In the GIP display, a timing controller TCON generates timing control signals and a level shifter LS outputs a plurality of gate driving control signals to be fed to the gate driver based on the timing control signals.

This will be described with reference to FIG. 1. The timing controller TCON may receive a first logic voltage VCC25, generate timing control signals, and feed the timing control signals to the level shifter LS. For example, the first logic voltage VCC25 may be 2.5 V. The timing controller TCON may constantly feed timing control signals to the level shifter LS until the first logic voltage VCC25 received drops to 2.5 V or below.

Also, the timing controller TCON receives a reset signal RST output from a reset IC (integrated circuit). The reset signal RST is input into the timing controller TCON at the initial stage of operation and switches the timing controller TCON from a floating state to a normal operating state. More specifically, at the initial stage of operation, the timing controller TCON turns on upon receiving a first logic voltage VCC25 of 2.5 V. However, the timing controller TCON remains in the floating state, during which the timing controller TCON may output unstable timing control signals. After a certain period of time, the timing controller TCON receives a reset signal RST, thereby preventing the output signals in the floating state from operating abnormally.

This period of time may be defined as the time (hereinafter referred to as "switching period Tc" or "switching period") it takes until the timing controller TCON receives the reset signal RST after turning on in response to receiving the first logic voltage VCC25 of 2.5 V. In other words, the switching period Tc is the time it takes for the timing controller TCON to switch from the floating state to the normal operating state.

The level shifter LS uses the first logic voltage VCC25 as input power, uses a second logic voltage VCC33 as output power, shifts the level of the timing control signals Tsig input from the timing controller TCON to 3.3 V, and outputs the shifted timing control signals Tsig. The level shifter LS enables level shifting upon receiving an output enable signal OE.

The output enable signal OE has an enable level at which the level shifter LS operates normally (e.g., the output enable signal OE is at a low state as the enable level), and a disable level at which the level shifter LS does not input and output signals.

However, a problem with the conventional level shifter LS is that even abnormal signals, output while the timing controller TCON is in the floating state, are level-shifted once the input power VCC25 and output power VCC33 are properly applied because the output enable signal OE is fixed at enable level LOW (e.g., the enable terminal EN is connected to a ground power source).

Moreover, at the initial stage of operation, the level shifter LS outputs abnormal signals while the timing controller TCON is in the floating state. The abnormal signals may couple with adjacent signals, and thus cause a glitch. The level shifter LS may even level-shift the abnormal signals caused by the glitch since the abnormal signals are available for output. In the case that an abnormal signal is input into the system or panel drive circuit of the display device, the abnormal signal may cause the display device to malfunction.

SUMMARY

Embodiments of the invention are directed to a display device which removes abnormal signals generated while a timing controller is in a floating state at the initial stage of operation, and a driving method thereof.

An embodiment of the present invention provides a display device comprising: a timing controller that is turned on to a floating state by a first logic voltage and, after a switching period, switches from the floating state to a normal operating state based on a reset signal to generate timing control signals; a level shifter configured to receive the first logic voltage and a second logic voltage and level-shift the timing control signals to the second logic voltage and outputs the same; and an output enable signal control part that outputs an output enable signal at enable level LOW or disable level HIGH, in synchronization with the reset signal, wherein, during the switching period, the level shifter receives the output enable signal at the disable level HIGH and does not level-shift the timing control signals.

Another embodiment of the present invention provides a display device comprising: a timing controller that receives a reset signal and generates timing control signals at a first logic voltage level; a level shifter that level-shifts the timing control signals to a second logic voltage level greater than the first logic voltage level, and outputs the same, and enables level-shifting in response to an output enable signal; and an output enable signal control part that controls the output enable signal to be at a disable level HIGH during a switching period, the second logic voltage changing to a first ON level at the start of the switching period, the reset signal changing to a second ON level at the end of the switching period, and controls the output enable signal to be at an enable level LOW after the switching period.

Another embodiment of the present invention provides a method of driving a display device comprising: generating timing control signals at a first logic voltage level in response to a reset signal; level-shifting the timing control signals to a second logic voltage level greater than the first logic voltage level, and outputting the same, and enabling level-shifting in response to an output enable signal; controlling the output enable signal to be at disable level OFF during a switching period, the second logic voltage changing to a first ON level at the start of the switching period, the reset signal changing to a second ON level at the end of the switching period, and controlling the output enable signal to be at enable level LOW after the switching period.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
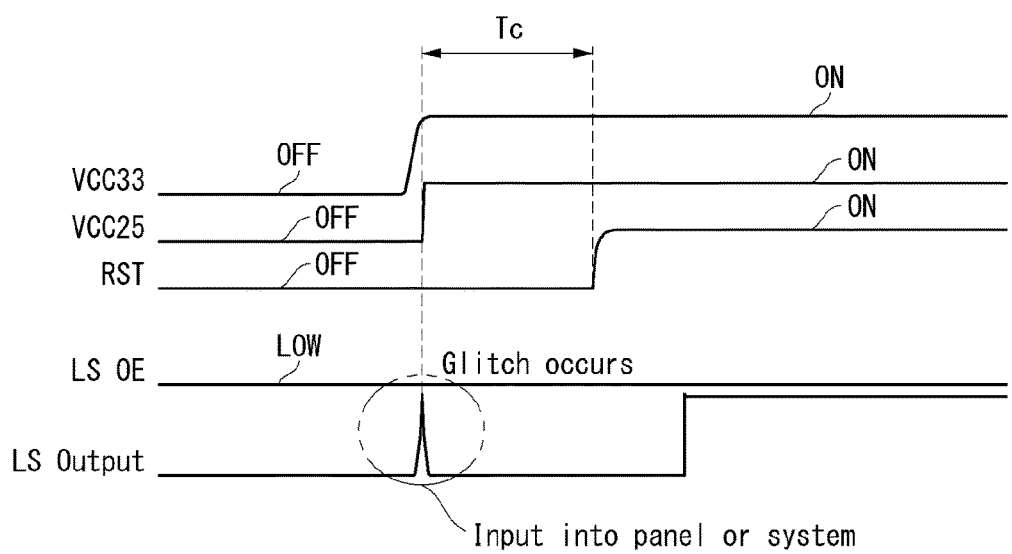
FIG. 1 is a waveform diagram showing that an abnormal signal is output from a level shifter while a timing controller is in a floating state, in a display device according to the related art.

Hereinafter, embodiments of the present invention will be described in detail with reference to the accompanying drawings. Like reference numerals designate substantially like elements throughout the specification. In the following description, detailed descriptions of well-known functions or configurations associated with embodiments of the present invention will be omitted if they are deemed to unnecessarily obscure the embodiments of the present invention.

It should be noted that, while the following description is directed to a liquid crystal display device as an example of a display device, embodiments of the present invention are not limited to liquid crystal displays but may be applicable to other types of display devices.

Concrete examples of the display devices may include a liquid crystal display device (LCD), a plasma display panel device (PDP), a field emission display device (FED), an organic light-emitting display device (OLED), etc.

The organic light-emitting display device comprises a plurality of pixels. Each pixel comprises an organic light-emitting diode composed of an organic emission layer formed between an anode and a cathode, and a pixel drive circuit that independently drives the organic light-emitting diode. The pixel drive circuit comprises a switching thin film transistor (hereinafter referred to as "TFT"), a driving TFT, and a capacitor. The switching TFT charges the capacitor with a data voltage in response to a scan pulse, and the driving TFT adjusts the amount of light emitted by the organic light-emitting diode by controlling the amount of current supplied to the organic light-emitting diode in accordance with the data voltage charged in the capacitor.

The display device may be implemented in liquid crystal modes such as TN (twisted nematic) mode, VA (vertical alignment) mode, IPS (in-plane switching) mode, FFS (fringe field switching) mode, etc. Also, the display device may be implemented as any type of display device such as a transmissive liquid crystal display, a semi-transmissive liquid crystal display, or a reflective liquid crystal display.

Figure 2:
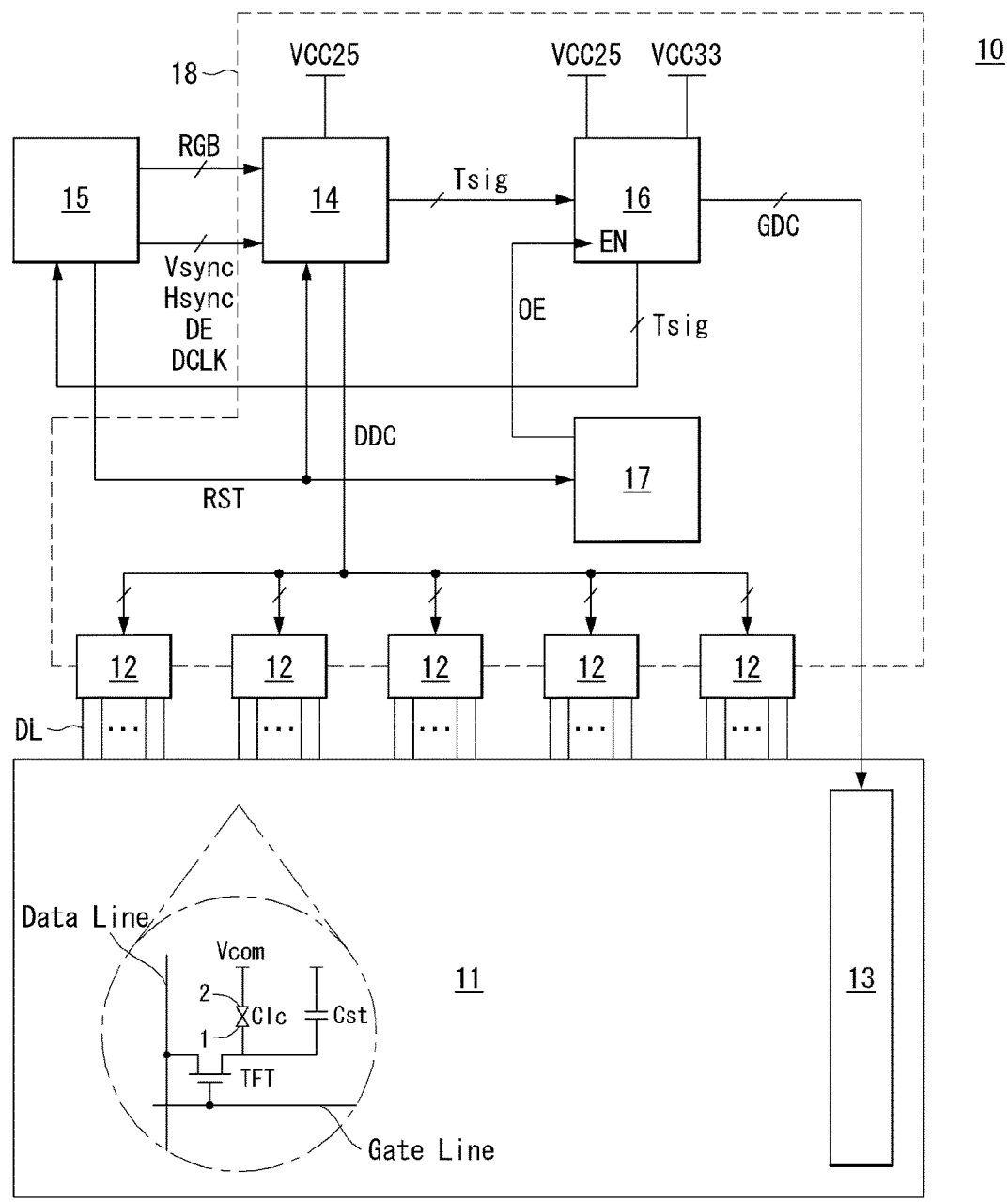
FIG. 2 is a block diagram showing a display device according to an embodiment of the present invention.
Figure 3:
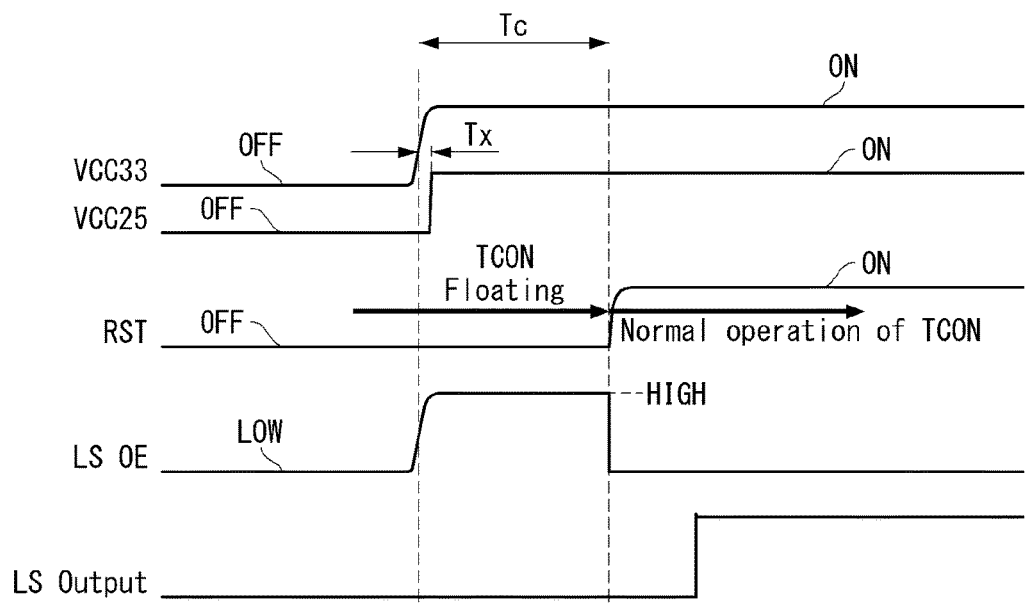
FIG. 3 is a waveform diagram showing signals input into a timing controller and level shifter in an embodiment of the present invention and the resulting output signals from the level shifter.
Figure 4:
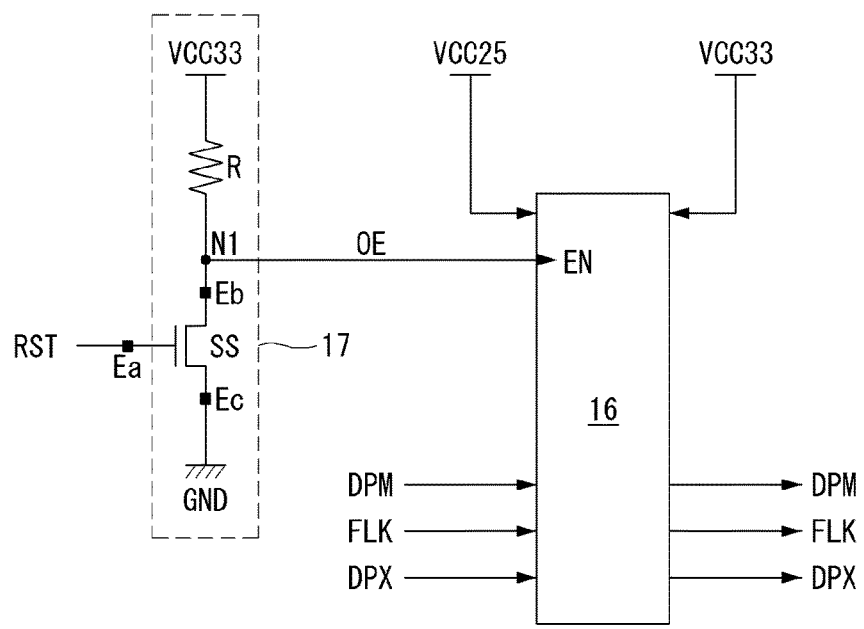
FIG. 4 is a circuit diagram that shows outputting an output enable signal at enable level LOW or disable level HIGH, in synchronization with a reset signal.

FIG. 2 is a block diagram showing a display device according to an embodiment of the present invention. FIG. 3 is a waveform diagram showing signals input into a timing controller and level shifter in an embodiment of the present invention and the resulting output signals from the level shifter. FIG. 4 is a circuit diagram that shows outputting an output enable signal at enable level LOW or disable level HIGH, in synchronization with a reset signal.

Referring to FIGS. 2 to 4, a display device 10 according to one embodiment comprises a display panel 11, a data drive circuit 12, a gate drive circuit 13, a timing controller 14, a level shifter 16, and an output enable signal control part (OECP) 17.

The display panel 11 comprises data lines and gate lines crossing each other and pixels arranged in a matrix.

The display panel 11 comprises an upper substrate and lower substrate facing each other with liquid crystal cells Clc in between. A pixel array comprising the pixels arranged in a matrix is formed on the display panel 11, and an input image is displayed on the pixel array. The pixel array comprises a TFT array formed on the lower substrate and a color filter array formed on the upper substrate. In the TFT array, TFTs (thin film transistors) are formed at the crossings of the data lines and gate lines. The TFTs supply a data voltage from the data lines to the pixel electrodes 1 of the liquid crystal cells Clc in response to a gate pulse from the gate lines. Each of the liquid crystal cells Clc produces a desired grayscale by controlling light transmission based on the difference between a data voltage stored in the pixel electrode 1 and a common voltage Vcom applied to a common electrode 2. A storage capacitor Cst for maintaining the data voltage stored in the pixel electrode 1 for a given frame period is connected to the liquid crystal cell Clc. The color filter array comprises color filters and a black matrix. Polarizers are attached to the upper and lower substrates of the display panel 11, and an alignment film for setting a pre-tilt angle of liquid crystal is formed.

The data drive circuit 12 may be implemented as a source drive IC. The data drive circuit 12 receives digital video data RGB from the timing controller 14. The data drive circuit 12 generates a data voltage by converting the digital video data RGB to a gamma compensation voltage in response to data driving control signals DDC from the timing controller 14. The data drive circuit 12 supplies the data voltage to the data lines DL of the display panel 11 in synchronization with the gate pulse. The data drive circuit 12 may be connected to the data lines DL of the display panel 11 using the COG (chip-on-glass) process or TAB (tape-automated bonding) process.

A gate drive circuit 13 may be formed directly on the lower substrate of the display panel 11 by GIP (gate-in-panel) technology. The gate drive circuit 13 may be formed in a non-display area outside a pixel area of the display panel 11 where an image is displayed. The gate drive circuit 13 may be implemented as a gate drive IC and connected to the gate lines GL of the display panel 11 by the TAB (tape-automated bonding) process. The gate drive circuit 13 generates a gate pulse in response to gate driving control signals GDC form the timing controller 14 and supplies this gate pulse to the gate lines GL by a line-sequential method. A horizontal line to be charged with the data voltage is selected in accordance with the gate pulse.

Referring to FIG. 2, the timing controller 14 receives digital video data RGB from a host system 15, and receives timing signals such as a vertical synchronization signal Vsync, a horizontal synchronization signal Hsync, a data enable signal DE, and a dot clock DCLK. The timing controller 14 transmits the digital video data RGB to the source drive ICs of the data drive circuit 12. The timing controller 14 generates data driving control signals DDC for controlling the timing of operation of the source drive ICs and gate driving control signals GDC for controlling the timing of operation of the gate drive circuit 13 by using the timing signals Vsync, Hsync, DE, and DCLK.

The data driving control signals DDC may include a source start pulse SSP, a source sampling clock SSC, a source output enable signal SOE, and a polarity control signal POL. The source start pulse SSP and the source sampling clock SSC control the timing of data sampling. The polarity control signal POL controls the timing of when to invert the polarity of a data voltage output from the data drive circuit 12. The source output enable signal SOE controls the output timing and charge share timing of the data drive circuit 12.

The gate driving control signals GDC may include a gate start pulse GSP and a gate shift clock GSC. The gate start pulse GSP controls the timing of a first gate pulse. The gate shift clock GSC is a clock signal for shifting the gate start pulse GSP.

Moreover, the timing controller 14 receives a first logic voltage VCC 25, and generates timing control signals Tsig and supplies Tsig to the level shifter 16. The timing control signals Tsig may include a gate modulation signal (FLK shown in FIG. 4) for controlling the timing of modulation of a gate pulse, a power enable signal (DPM shown in FIG. 4) for controlling the timing of generation of various types of electric power applied to the panel drive circuit, and a ready signal (DPX shown in FIG. 4) for informing the host system 15 that the timing controller 14 is ready to receive data.

Referring to FIGS. 2 and 3, at the initial stage of operation, the timing controller 14 turns on upon receiving a first logic voltage VCC25. However, the timing controller 14 remains in the floating state, during which the timing controller 14 may output unstable timing control signals. After a switching period Tc, the timing controller 14 receives a reset signal RST from a reset IC (integrated circuit) and switches to a normal operating state. That is, the timing controller 14 remains in the floating state from the initial stage of operation until the reset signal RST is received. The timing controller 14 operates in the normal operating state once the reset signal RST is received.

The actual timing for the timing controller 14 to generate the timing control signals Tsig is when the reset signal RST, rather than the first logic voltage VCC25, is applied at the ON level. Even with the first logic voltage VCC25 applied at the ON level, the timing controller 14 remains in the floating state until the reset signal RST is applied at the ON level.

The reset IC may be embedded in the host system 15 or mounted on a control board 18.

The level shifter 16 uses the first logic voltage VCC25 as input power and a second logic voltage VCC33, which is greater than the first logic voltage VCC25, as output power to boost (shift) the timing control signals Tsig input from the timing controller 14 to the second logic voltage VCC33. The level shifter 16 may supply the gate driving control signals GDC, among the boosted timing control signals Tsig, to the gate drive circuit 13, and supply the other boosted timing control signals Tsig to the host system 15. The first logic voltage VCC25, which is the input power to the level shifter 16 and timing controller 14, may be 2.5 V or any other suitable voltage level. The second logic voltage VCC33, which is the output power of the level shifter 16, may be 3.3 V or any other suitable voltage level.

The operation of the level shifter 16 is controlled by an output enable signal OE that is input into the enable terminal EN of the level shifter 16. The output enable signal OE has an enable level at which the level shifter 16 operates normally (that is, the output enable signal OE is at low state), and a disable level at which the level shifter 16 does not input and output signals.

In one embodiment, the output enable signal OE applied from the output enable signal control part 17 is fixed at enable level LOW, for example, the enable terminal EN is connected to a ground power source.

As shown in FIG. 3, the output enable signal OE applied from the output enable signal control part 17 changes from a disable level LOW to a disable level HIGH during a switching period Tc from when the second logic voltage VCC33 changes to a first ON level to when the reset signal RST changes to a second ON level (not necessarily the same as the first ON level). The output enable signal OE becomes enable level LOW after completion of the switching period Tc. The output enable signal control part 17 controls the output enable signal OE to be at disable level HIGH during the switching period Tc in which abnormal signals such as glitches may occur, which can prevent the level shifter 16 from outputting abnormal signals. Accordingly, the switching period Tc may be a period for preventing the output of abnormal signals.

At the initial stage of operation, when the first logic voltage VCC25 rises to a third ON level in the switching period Tc, during which the timing controller 14 is in the floating state, unstable timing control signals Tsig are output from the timing controller 14. The unstable timing control signals Tsig may be coupled with adjacent signals, thereby causing a glitch. In this case, the level shifter 16 is controlled to be at disable level HIGH by the output enable signal OE, and therefore becomes unavailable for output. Accordingly, the level shifter 16 is prevented from outputting the unstable timing control signals Tsig output from the timing controller 14 as abnormal signals caused by the glitch. To ensure proper operation, the timing of application of the second logic voltage VCC33 at the first ON level (e.g., corresponding to the start of the switching period Tc) may be a certain amount of time Tx preceding the timing of application of the first logic voltage VCC25 at the third ON level (e.g., corresponding to the timing of a potential glitch).

Under control of the output enable signal control part 17, the level shifter 16 stops the level shifting and output of the timing control signals Tsig during the switching period Tc, in response to the output enable signal OE of disable level HIGH. The level shifter 16 starts the level shifting and output of the timing control signals Tsig after completion of the switching period Tc, in response to the output enable signal OE being at enable level LOW.

Referring to FIG. 4, the output enable signal control part 17 may control the logic level of the output enable signal OE based on the reset signal RST. In an embodiment, the output enable signal control part 17 comprises a switching element SS and a resistor R, as shown in FIG. 4.

The switching element SS comprises a control electrode Ea connected to an input terminal of the reset signal RST, a first electrode Eb connected to a first node N1 that outputs the output enable signal OE, and a second electrode Ec connected to a ground voltage source GND. The switching element SS may be implemented as a field effect transistor FET or as a bipolar junction transistor BJT.

The output enable signal control part 17 may also include a resistor R coupled between an input terminal of the second logic voltage VCC33 and the first node N1.

If the reset signal RST is input at an OFF level, the output enable signal control part 17 supplies the second logic voltage VCC33 as the output enable signal OE by blocking an electrical flow between the first node N1 and the ground voltage source GND using the switching element SS. That is, the output enable signal control part 17 outputs the output enable signal OE at disable level HIGH (e.g., corresponding to the second logic voltage VCC33) during the switching period Tc when the reset signal RST is input at the OFF level.

If the reset signal RST is input at an ON level, the output enable signal control part 17 allows an electrical flow between the first node N1 and the ground voltage source GND using the switching element SS. That is, the output enable signal control part 17 outputs the output enable signal OE at enable level LOW (e.g., corresponding to the ground voltage source GND) during the switching period Tc when the reset signal RST is input at the ON level.

Referring to FIG. 2, the timing controller 14, the level shifter 16, and the output enable signal control part 17 may be mounted on the control board 18.

Figure 5:
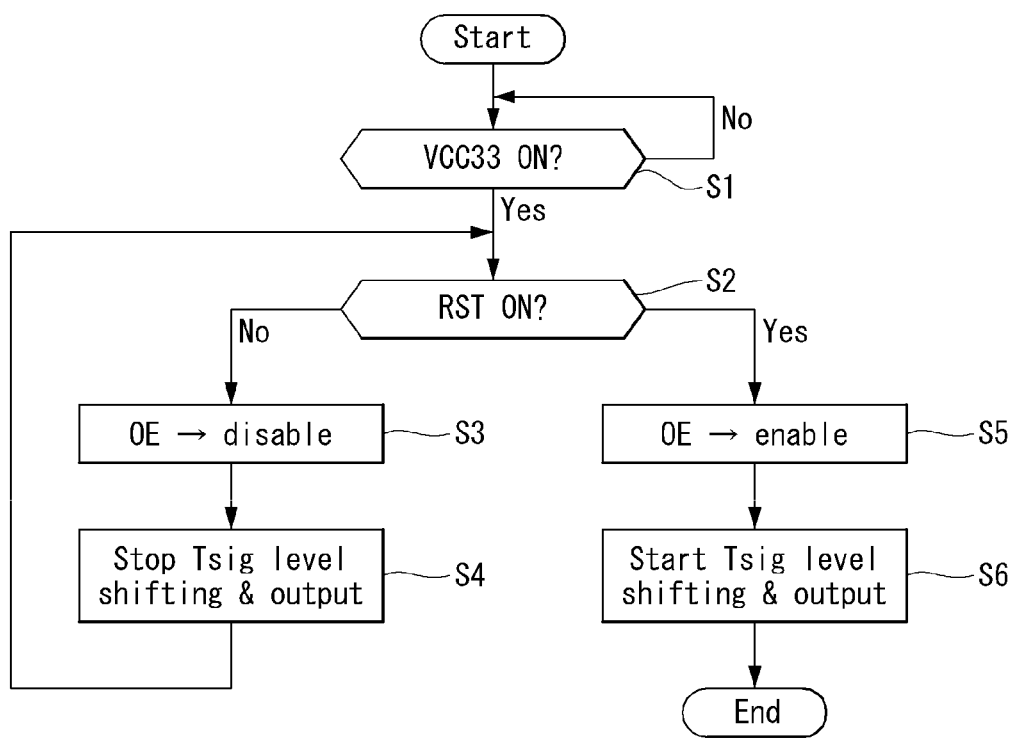
FIG. 5 is a flowchart showing a method of driving a display device according to an embodiment of the present invention.

FIG. 5 illustrates a method of driving a display device according to an embodiment of the present invention.

Referring to FIG. 5, the method of driving a display device according to an embodiment of the present invention comprises: generating timing control signals Tsig of a first logic voltage level VCC25 in response to a reset signal RST; shifting the timing control signals Tsig to a second logic voltage level VCC33, higher than the first logic voltage level VCC25, outputting the shifted timing control signals Tsig; enabling level shifting in response to an output enable signal OE; controlling the output enable signal OE to be at a disable level HIGH during a switching period Tc from when the second logic voltage VCC33 changes to a first ON level to when the reset signal RST changes to a second ON level (S1, S2, and S3); and controlling the output enable signal OE to be at an enable level LOW after completion of the switching period Tc (S1, S2, and S5).

In the enabling of level-shifting in response to an output enable signal OE, the level-shifting and output of the timing control signals Tsig are stopped during the switching period Tc, in response to the output enable signal OE of disable level HIGH (S4).

In the enabling of level-shifting in response to an output enable signal OE, the level-shifting and output of the timing control signals Tsig are started after completion of the switching period Tc, in response to the output enable signal OE of enable level LOW (S6).

As described above, embodiments of the present invention allow for controlling an output enable signal input into the level shifter to be at disable level during a switching period Tc in which an abnormal signal may occur, thereby stopping the operation of the level shifter during the switching period Tc and preventing the output of an abnormal signal. Thus, embodiments of the present invention can prevent a malfunction of a display device by preventing abnormal signals from being generated when the timing controller is in the floating state at the initial stage of operation.

Embodiments of the present invention may apply to other ICs that operate normally after remaining in a floating state during a predetermined period at the initial stage of operation, as well as to the timing controller.

Throughout the description, it should be understood for those skilled in the art that various changes and modifications are possible without departing from the technical principles of embodiments of the present invention. Therefore, the technical scope of embodiments of the present invention is not limited to those detailed descriptions in this document.

The embodiments of the invention may be described as follows.

An embodiment of the present invention provides a display device comprising: a timing controller that is turned on to a floating state by a first logic voltage and, after a switching period, switches from the floating state to a normal operating state based on a reset signal to generate timing control signals; a level shifter configured to receive the first logic voltage and a second logic voltage and level-shift the timing control signals to the second logic voltage and outputs the same; and an output enable signal control part that outputs an output enable signal at enable level LOW or disable level HIGH, in synchronization with the reset signal, wherein, during the switching period, the level shifter receives the output enable signal at the disable level HIGH and does not level-shift the timing control signals.

During the switching period, the timing controller may output abnormal signals which are coupled with adjacent signals and therefore cause a glitch.

After the switching period, the level shifter receives the output enable signal at the enable level LOW and level-shifts the timing control signals to the second logic voltage and outputs the same.

Some of the level-shifted timing control signals are supplied to a gate drive circuit, and the other level-shifted timing control signals are supplied to a host system.

In some embodiments, the output enable signal control part comprises a switching element and a resistor that control the output enable signal.

In some embodiments, the switching element comprises: a first electrode that receives the reset signal, a second electrode that outputs the output enable signal, and a third electrode connected to a ground voltage source.

In some embodiments, the second electrode is connected in series to the resistor and an input terminal of the second logic voltage.

Another embodiment of the present invention provides a display device, the display device comprising: a timing controller that receives a reset signal and generates timing control signals at a first logic voltage level, a level shifter that level-shifts the timing control signals to a second logic voltage level greater than the first logic voltage level, and outputs the same, and enables level-shifting in response to an output enable signal, and an output enable signal control part that controls the output enable signal to be at a disable level HIGH during a switching period, the second logic voltage changing to a first ON level at the start of the switching period, the reset signal changing to a second ON level at the end of the switching period, and controls the output enable signal to be at an enable level LOW after the switching period.

The level shifter does not level-shift or output the timing control signals during the switching period in response to the output enable signal being at the disable level HIGH.

The level shifter level-shifts and outputs the timing control signals after the switching period in response to the output enable signal being at the enable level LOW.

The second logic voltage changes to the first ON level before the first logic voltage changes to a third ON level.

In some embodiments, the output enable signal control part comprises: a switching element comprising a control electrode connected to an input terminal of the reset signal, a first electrode connected to a first node that outputs the output enable signal, and a second electrode connected to a ground voltage source, and a resistor connected between an input terminal of the second logic voltage and the first node.

The switching element may be a field effect transistor or a bipolar junction transistor.

Another embodiment of the present invention provides a method of driving a display device comprising: generating timing control signals at a first logic voltage level in response to a reset signal; level-shifting the timing control signals to a second logic voltage level greater than the first logic voltage level, and outputting the same, and enabling level-shifting in response to an output enable signal; controlling the output enable signal to be at disable level HIGH during a switching period, the second logic voltage changing to a first ON level at the start of the switching period, the reset signal changing to a second ON level at the end of the switching period, and controlling the output enable signal to be at enable level LOW after the switching period.

In some embodiments, the enabling of level shifting in response to the output enable signal, the level-shifting and outputting of the timing control signals are stopped during the switching period in response to the output enable signal being at the disable level HIGH.

In some embodiments, the enabling of level shifting in response to the output enable signal, the level-shifting and outputting of the timing control signals are started after the switching period, in response to the output enable signal being at the enable level LOW.

The second logic voltage changes to the first ON level before the first logic voltage changes to a third ON level.

What is claimed is:

1. A display device comprising:
   a timing controller that is turned on to a floating state by a first logic voltage and, after a switching period, switches from the floating state to a normal operating state based on a reset signal to generate timing control signals;
   a level shifter configured to receive the first logic voltage and a second logic voltage and level-shift the timing control signals to the second logic voltage; and
   an output enable signal control part that outputs an output enable signal at disable level HIGH when the timing controller is turned on to the floating state and outputs the output enable signal at enable level LOW when the timing controller switches from the floating state to the normal operating state,
   wherein, during the switching period, the level shifter receives the output enable signal at the disable level HIGH and does not level-shift the timing control signals, and
   wherein after the switching period, the level shifter receives the output enable signal at the enable level LOW and performs level-shift of the timing control signals.

2. The display device of claim 1, wherein the second logic voltage is greater than the first logic voltage.

3. The display device of claim 1, wherein, after the switching period, the level shifter receives the output enable signal at the enable level LOW and level-shifts the timing control signals to the second logic voltage.

4. The display device of claim 3, wherein a first subset of the level-shifted timing control signals are supplied to a gate drive circuit, and wherein a second subset of the level-shifted timing control signals are supplied to a host system.

5. The display device of claim 1, wherein the output enable signal control part comprises a switching element and a resistor that control the output enable signal.

6. The display device of claim 5, wherein the switching element comprises:
   a first electrode that receives the reset signal;
   a second electrode that outputs the output enable signal; and
   a third electrode connected to a ground voltage source.

7. The display device of claim 6, wherein the second electrode is connected in series to the resistor and an input terminal of the second logic voltage.

8. A display device comprising:
   a timing controller that is turned on to a floating state by a first logic voltage and, after a switching period, switches from the floating state to a normal operating state based on a reset signal to generate timing control signals;
   a level shifter that level-shifts the timing control signals to a second logic voltage level greater than the first logic voltage level, and enables level-shifting in response to an output enable signal; and
   an output enable signal control part that controls the output enable signal to be at a disable level HIGH during a switching period when the timing controller is turned on to the floating state and, the second logic voltage changing to a first ON level at the start of the switching period when the timing controller switches from the floating state to the normal operating state, the reset signal changing to a second ON level at the end of the switching period, and controls the output enable signal to be at an enable level LOW after the switching period.

9. The display device of claim 8, wherein the level shifter does not level-shift or output the timing control signals during the switching period in response to the output enable signal being at disable level OFF.

10. The display device of claim 8, wherein the level shifter level-shifts and outputs the timing control signals after the switching period in response to the output enable signal being at the enable level LOW.

11. The display device of claim 8, wherein the second logic voltage changes to the first ON level before the first logic voltage changes to a third ON level.

12. The display device of claim 8, wherein the output enable signal control part comprises:
   a switching element comprising a control electrode connected to an input terminal of the reset signal, a first electrode connected to a first node that outputs the output enable signal, and a second electrode connected to a ground voltage source; and
   a resistor connected between an input terminal of the second logic voltage and the first node.

13. The display device of claim 12, wherein the switching element is a field effect transistor or a bipolar junction transistor.

14. A method of driving a display device comprising:
generating timing control signals at a first logic voltage level in response to a reset signal;
level-shifting the timing control signals to a second logic voltage level greater than the first logic voltage level;
enabling level-shifting in response to an output enable signal;
controlling the output enable signal to be at disable level HIGH during a switching period, the second logic voltage changing to a first ON level at the start of the switching period, the reset signal changing to a second ON level at the end of the switching period; and
controlling the output enable signal to be at enable level LOW after the switching period, wherein the output enable signal is at the disable level HIGH when a timing controller is turned on to a floating state, and wherein the output enable signal is at the enable level LOW when the timing controller switches from the floating state to a normal operating state.

15. The method of claim 14, wherein the enabling of level shifting in response to the output enable signal and the level-shifting of the timing control signals are stopped during the switching period in response to the output enable signal being at the disable level OFF.

16. The method of claim 14, wherein the enabling of level shifting in response to the output enable signal and the level-shifting of the timing control signals are started after the switching period in response to the output enable signal being at the enable level LOW.

17. The method of claim 14, wherein the second logic voltage changes to the first ON level before the first logic voltage changes to a third ON level.

\* \* \* \* \*